(12) United States Patent
Wang et al.

(10) Patent No.: US 10,797,707 B2
(45) Date of Patent: Oct. 6, 2020

(54) DELAY LOCKED LOOP DETECTION METHOD AND SYSTEM

(71) Applicant: CSMC TECHNOLOGIES FAB2 CO., LTD., Wuxi New District, Jiangsu (CN)

(72) Inventors: Xueyan Wang, Jiangsu (CN); Ying Yang, Jiangsu (CN); Jingjia Yu, Jiangsu (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 272 days.

(21) Appl. No.: 15/741,448

(22) PCT Filed: May 10, 2016

(86) PCT No.: PCT/CN2016/081586
§ 371 (c)(1),
(2) Date: Jan. 2, 2018

(87) PCT Pub. No.: WO2017/000672
PCT Pub. Date: Jan. 5, 2017

(65) Prior Publication Data
US 2018/0375521 A1    Dec. 27, 2018

(30) Foreign Application Priority Data
Jul. 2, 2015    (CN) .......................... 2015 1 0383366

(51) Int. Cl.
*H03L 7/081*    (2006.01)
*H03L 7/08*     (2006.01)
*H03L 7/00*     (2006.01)

(52) U.S. Cl.
CPC .............. *H03L 7/0812* (2013.01); *H03L 7/00* (2013.01); *H03L 7/08* (2013.01)

(58) Field of Classification Search
CPC .............. H03L 7/812; H03L 7/00; H03L 7/08
See application file for complete search history.

(56) References Cited

U.S. PATENT DOCUMENTS 6,140,854 A * 10/2000 Coddington .............. G06F 1/10
                                                                    327/149
7,567,103 B2    7/2009 Park et al.
(Continued)

FOREIGN PATENT DOCUMENTS

CN        1518226        8/2004
CN        1913361        2/2007
(Continued)

OTHER PUBLICATIONS

International Search Report for international appl. No. PCT/CN2016/081586, dated Jul. 21, 2016 (4 pages, including English translation).

*Primary Examiner* — Dominic E Hawkins
(74) *Attorney, Agent, or Firm* — Hamre, Schumann, Mueller & Larson, P.C.

(57) ABSTRACT

A delay locked loop detection system (10), the system can be used for detecting the working state of a delay locked loop (400) and comprises: a signal generator (300), which is used for generating a reference clock and providing the reference clock to the delay locked loop (400); and a testing instrument (500), which is used for acquiring the clock signals output from the delay locked loop (400) and measuring whether the time delays thereof are consistent with expectations; the detection system (10) further comprises at least one of the following circuits: a pre-receiving circuit (100), which is used for receiving the reference clock from the signal generator (300) and amplifying and shaping the reference clock and then providing the reference clock to the delay locked loop (400); and a multiphase multiplexing circuit (200), which is used for receiving the clock signals output from the delay locked loop (400) and synthesizing and then providing a plurality of clock signals with different delay to the testing instrument (500). Also included is a delay locked loop detection method. The system and method
(Continued)

mentioned above enable an accurate measurement for the delays of the delay locked loop.

16 Claims, 4 Drawing Sheets

(56) References Cited

U.S. PATENT DOCUMENTS

| | | | | |
|---|---|---|---|---|
| 7,570,093 B1* | 8/2009 | Huang | ................ | H03L 7/0812 327/149 |
| 2002/0053048 A1* | 5/2002 | Matsumoto | ...... | G01R 31/31709 714/100 |
| 2006/0122521 A1* | 6/2006 | Chen | ................ | A61B 5/02438 600/503 |
| 2007/0182471 A1* | 8/2007 | Kim | .................... | H03L 7/0812 327/158 |
| 2008/0120059 A1* | 5/2008 | Awaji | ................ | G01R 31/3016 702/125 |
| 2008/0157837 A1* | 7/2008 | Na | ............................ | H03L 7/07 327/158 |
| 2008/0246520 A1* | 10/2008 | Ma | ........................ | H03L 7/0805 327/158 |
| 2009/0085616 A1* | 4/2009 | Wada | ..................... | H03K 5/135 327/117 |
| 2009/0116306 A1* | 5/2009 | Song | ........................ | G11C 7/22 365/189.09 |
| 2009/0256577 A1* | 10/2009 | Hasumi | ................ | H03L 7/0812 324/555 |
| 2010/0271098 A1* | 10/2010 | Jeffries | .................. | H02M 3/07 327/175 |

FOREIGN PATENT DOCUMENTS

| | | |
|---|---|---|
| CN | 101540605 | 9/2009 |
| KR | 20060065352 | 6/2006 |

* cited by examiner

DELAY LOCKED LOOP DETECTION METHOD AND SYSTEM

FIELD OF THE INVENTION

The present disclosure relates to circuit testing technology, and more particularly relates to delay locked loop detection method and system.

BACKGROUND OF THE INVENTION

A delay locked loop (DLL) generates multiple clocks with same frequency of a reference clock but different delays based on the reference clock.

FIG. 1 illustrates a block diagram of a conventional delay locked loop detection system. The delay locked loop 1 is an object to be detected that receives a reference clock and generates multiple different delayed clocks based on the reference clock and delay parameters. A signal generator 2 is used to generate the reference clock. A testing instrument 3 is used to test the delayed clocks output from the delay locked loop 1 and determine whether the delayed clocks are consistent with target clocks.

Before inputting into the DLL 1, the reference clock may attenuate and distort due to an influence of a testing environment, therefore directly affecting a normal operation of the DLL 1. In addition, multiple different delayed clocks may also be affected by the testing environment before reaching the testing instrument 3, therefore causing time delays thereof to change. With the development of semiconductor technology, frequency of clocks that can be provided increases continuously, thus the above mentioned influence is becoming more and more non-neglected. Therefore, how to accurately measure time delays between clocks becomes very difficult.

Due to that changes of the time delays of the multiple delayed clocks may be different, an accurate result may not be measured finally. In addition, since multiple delayed clocks need one-by-one measurement, consumption of a driving circuit is large, and jitters of a power supply and the ground are increased, thus interfering with the normal operation of the delay locked loop 1, which makes a testing progress complicated and difficult.

SUMMARY OF THE DISCLOSURE

Accordingly, it is necessary to provide a delay locked loop detection system that can improve measurement accuracy.

In addition, a delay locked loop detection method that can improve measurement accuracy is also provided.

A system of detecting a working state of a delay locked loop includes:

a signal generator for generating a reference clock;

a pre-receiving circuit for receiving the reference clock of the signal generator, amplifying and shaping the reference clock, and then providing an amplified and shaped reference clock for the delay locked loop; and a testing instrument for acquiring clock signals output from the delay locked loop, and determining whether the time delays of the clock signals are consistent with expectations.

A method of detecting a working state of a delay locked loop includes: amplifying and shaping a reference clock; inputting an amplified and shaped reference clock into the delay locked loop; and receiving clock signals output from the delay locked loop and testing the clock signals.

In above mentioned system and method, the reference clock is first amplified and shaped by the pre-receiving circuit and then input into the delay locked loop, thus solving a problem that a testing environment may deteriorate an input signal.

In addition, a system of detecting a working state of a delay locked loop includes:

a signal generator for generating a reference clock and providing the reference clock for the delay locked loop;

a testing instrument for acquiring clock signals output from the delay locked loop, and determining whether time delays of the clock signals are consistent with expectations; and a multiphase multiplexing circuit for receiving the clock signals output from the delay locked loop, synthesizing multiple clock signals with different delays, and then providing a synthesized signal for the testing instrument.

A method of detecting a working state of a delay locked loop includes: inputting a reference clock into the delay locked loop; receiving clock signals output from the delay locked loop; synthesizing multiple clock signals with different delays, and testing a synthesized signal.

In the system and in the method, a multiphase clock signal, which originally leads to multiple clock signals with different phases, generated by the delay locked loop are first synthesized by the multiphase multiplexing circuit into a synthesized signal, and then the synthesized signal is output to the testing instrument. To measure delays between multiple clock signals only needs to measure frequency and jitter of the output synthesized signal, avoiding leading to multiple clock measurements. The system and the method do not require matching of multiple clock paths and need lower requirements on the testing environment and the testing instrument.

In addition, the system and the method may further include a pre-receiving circuit. The system and the method utilize a hysteresis function of the pre-receiving circuit to filter out small signal noises, which is beneficial for signal shaping and signal receiving of post circuits.

DETAILED DESCRIPTION OF THE EMBODIMENTS

The disclosure will now be further illustrated with reference to the following drawings and embodiments.

Figure 1:
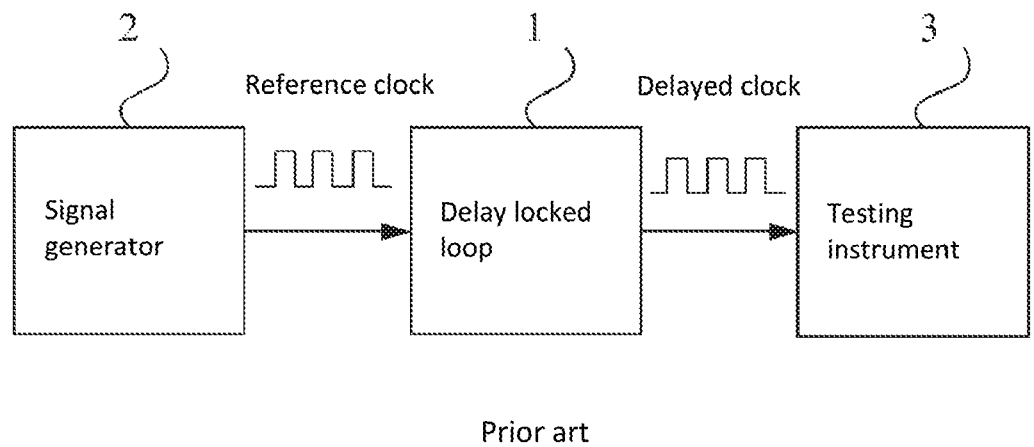
FIG. 1 is a block diagram of a conventional delay locked loop detection system.
Figure 2:
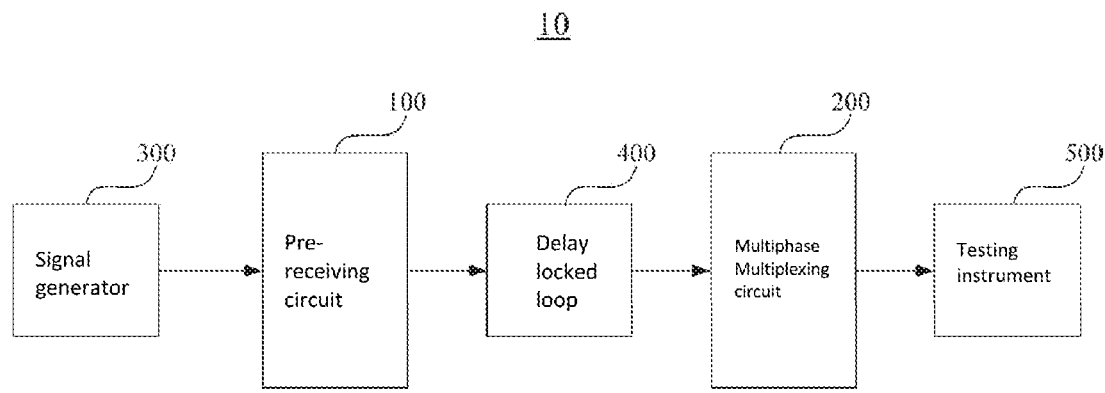
FIG. 2 is a block diagram of a delay locked loop detection system in accordance with an embodiment.

FIG. 2 is a block diagram of a delay locked loop detection system in accordance with an embodiment. The delay locked loop detection system 10 can be used for detecting a working state of a delay locked loop 400, that is, to detect whether time delays of clock signals output from the delay locked loop 400 are consistent with expectations. The detection system includes a pre-receiving circuit 100, a multiphase multiplexing circuit 200, a signal generator 300, and a testing instrument 500. The signal generator 300, the pre-receiving circuit 100, the delay locked loop 400, the multiphase multiplexing circuit 200, and the testing instrument 500 are coupled with each other sequentially.

The signal generator 300 is used for generating a reference clock. The pre-receiving circuit 100 receives the reference clock of the signal generator 300, amplifies and shapes the reference clock, and then provides an amplified and shaped reference clock to the delay locked loop 400. According to the provided reference clock and pre-set delay parameters, the delay locked loop 400 can generate multiple clock signals with different delays with respect to the reference clock. The multiphase multiplexing circuit 200 receives multiple clock signals with different delays output from the delay locked loop 400, synthesizes the multiple cock signals with different delays, and then provides a synthesized clock signal to the testing instrument 500. The testing instrument 500 acquires the synthesized clock signal output from the delay locked loop 400, and determines whether a time delay of the clock signal is consistent with expectation.

In above mentioned detection system, by adding the pre-receiving circuit 100, the reference clock can be amplified and shaped before being input into the delay locked loop, so as to reduce an influence of the reference clock input into the delay locked loop. By adding the multiphase multiplexing circuit 200, multiple delayed clocks can be synthesized into one clock so that clocks with different delays do not need to be coupled to different testing instruments through different lines during a measurement, thereby reducing measurement error.

It should be understood that, in order to maximize suppressing an influence of the environment, the detection system may include both of the pre-receiving circuit 100 and the multiphase multiplexing circuit at the same time. It should be noted that, a detection result can be improved to a certain degree by including the pre-receiving circuit 100 or the multiphase multiplexing circuit 200 alone. The degree of improvement depends on a performance of the pre-receiving circuit 100 or the multiphase multiplexing circuit 200.

Figure 3:
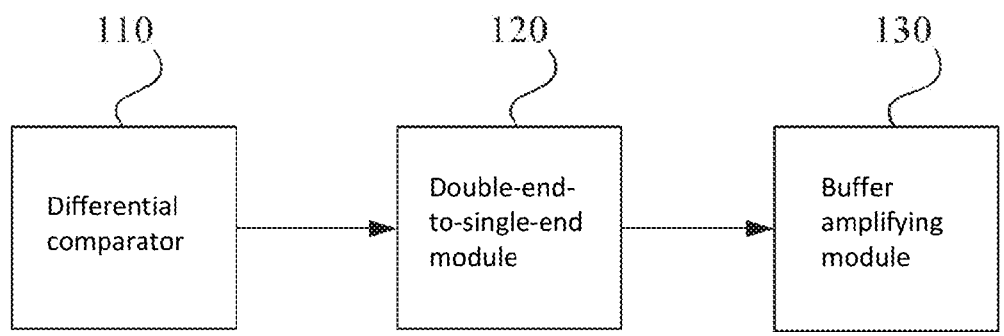
FIG. 3 is a block diagram of a pre-receiving circuit.

Specifically, the pre-receiving circuit 100 is an amplifying circuit with a hysteresis function. The hysteresis function changes a single input conversion voltage into two input conversion voltages, outputting an input threshold voltage $V^+_{TRP}$ corresponding to a transition from a high level to a low level and outputting an input threshold voltage $V^-_{TRP}$ corresponding to a transition from a low level to a high level. Only when an input voltage is higher than $V^+_{TRP}$, an output transits from a high level to a low level. Only when the input voltage is lower than $V^-_{TRP}$, the output transits from a low level to a high level, therefore reducing an impact of noise on the signal. As shown in FIG. 3, in the illustrated embodiment, the pre-receiving circuit 100 includes a differential comparator 110, a double-end-to-single-end module 120, and a buffer amplifying module 130, which are sequentially coupled with each other.

The differential comparator 110 amplifies the input reference clock and outputs a double-ended signal. The differential comparator 110 has a strong common mode rejection and is insensitive to fluctuations of a power supply and the ground. The differential comparator 110 further has a hysteresis function that can distinguish a signal even when signal amplitude is small and noise is great. Although the reference clock may be greatly attenuated and distorted during transmission from the signal generator 300 to the delay locked loop 400, it can be corrected by the differential comparator 110, therefore reducing the requirements of the testing environment.

The double-end-to-single-end module 120 is coupled to an output end of the differential comparator 110, and can receive the double-ended signal output from the differential comparator 110 and convert the double-ended signal into a single-ended signal. In many applications, signals are mostly single-ended signals, so that the double-ended signals output from the differential comparator 110 need to be converted into single-ended signals by the double-end-to-single-end module 120.

The buffer amplifying module 130 is coupled to an output end of the double-end-to-single-end module 120, and can receive the single-ended signal output from the double-end-to-single-end module 120, shape the single-ended signal, and increase a driving capability of the single-ended signal.

Even if the reference clock is attenuated and distorted by the testing environment, a standard square wave signal can be obtained after being processed by the above mentioned three modules.

It should be understood that, a main function of the pre-receiving circuit is to amplify and shape the reference clock, therefore an implementation manner is not limited to above specific modules and components, and can be other modules and components.

Figure 4:
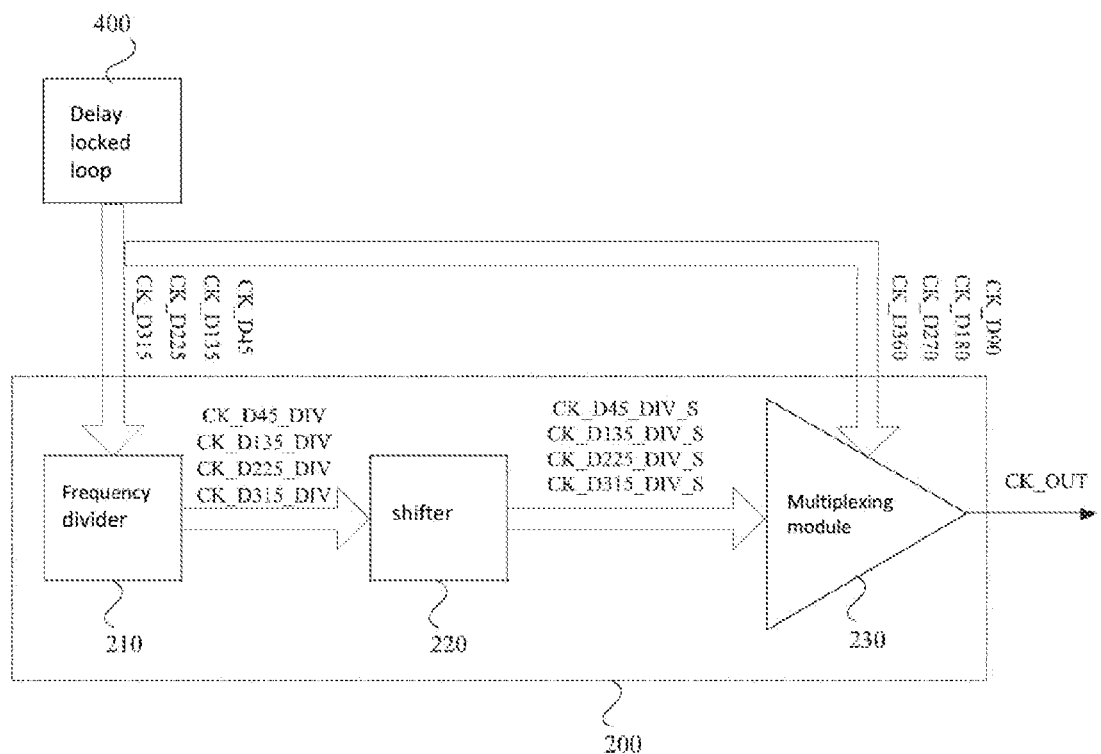
FIG. 4 is a block diagram of a multiphase multiplexing circuit.

As shown in FIG. 4, the multiphase multiplexing circuit 200 includes a frequency divider 210, a shifter 220, and a multiplexing module 230.

The frequency divider 210 receives N first type delayed clocks output from the delay locked loop 400, and N+1 frequency divides each first type delayed clock respectively, wherein a $n^{th}$ first type delayed clock is delayed by a phase of $(2n-1)\pi/N$ with respect to the reference clock, wherein $1 \leq n \leq N$. The shifter 220 shifts a frequency divided signal corresponding to the $n^{th}$ delayed clock by n−1 periods of the reference clock. The multiplexing module 230 selects N clock signals corresponding N second type delayed clocks respectively utilizing N shifted signals obtained by the shifter 220, and synthesize the N clock signals, wherein a $n^{th}$ second type delayed clock is delayed by a phase of $2n\pi/N$ with respect to a reference clock. After being processed by the above mentioned three modules, the N first type delayed clocks are synthesized into a synthesized clock whose frequency is N/N+1 times of a frequency of the reference clock.

Figure 5:
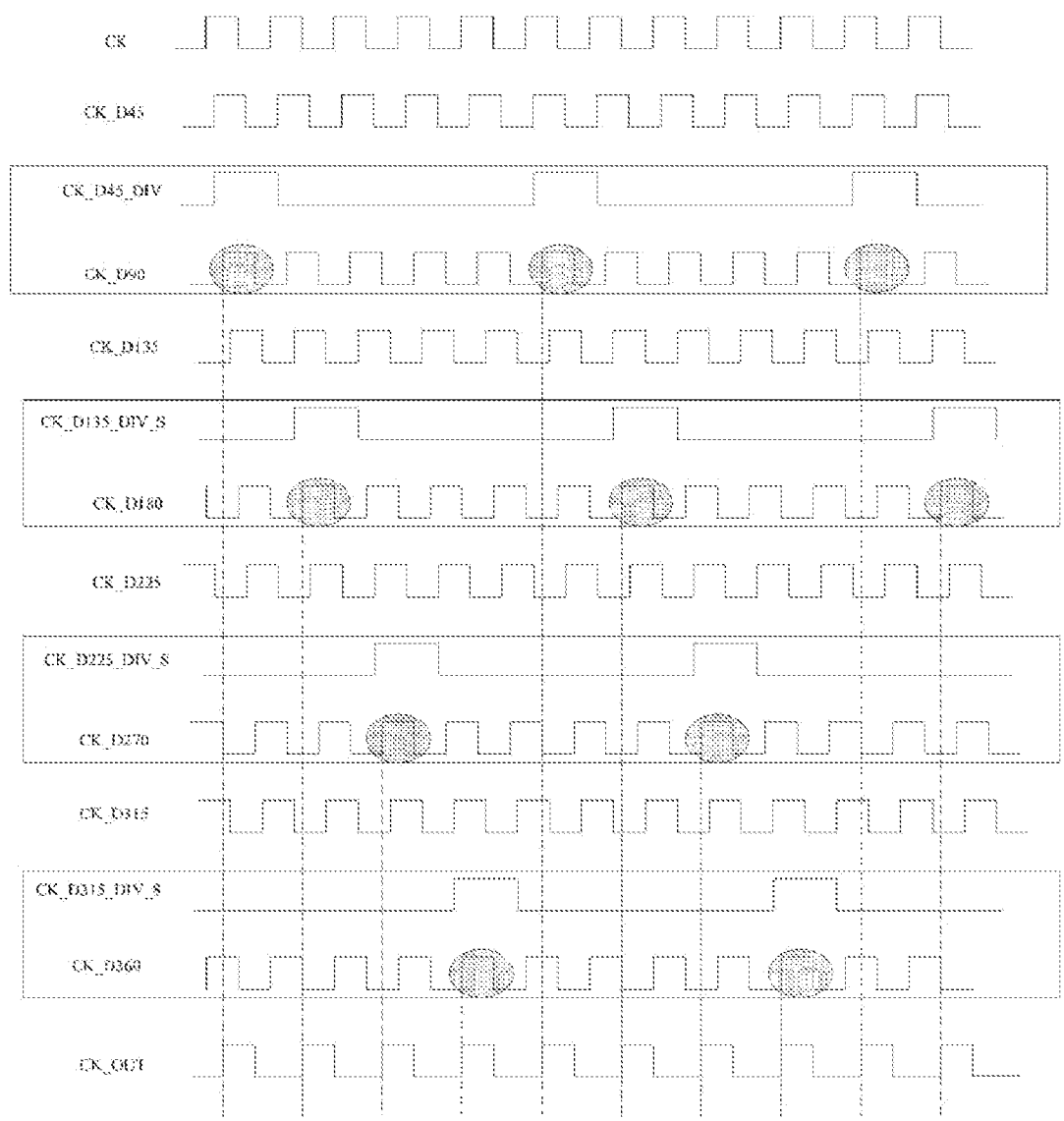
FIG. 5 is a time chart of each signal when synthesizing four delayed signals.

Referring to FIG. 4 and FIG. 5, the following is specifically described when N=4.

The reference clock is indicated as CK. The delay locked loop 400 outputs four different delayed signals CK_D45, CK_D135, CK_D225, and CK_D315, which are obtained by being delayed by $\pi/4$, $3\pi/4$, $5\pi/4$, and $7\pi/4$ on the basis of the reference clock respectively.

Four different delayed signals CK_D45, CK_D135, CK_D225, and CK_D315 are respectively five frequency divided to obtain signals CK_D45_DIV, CK_D135_DIV, CK_D225_DIV and CK_D315_DIV.

For the first divided signal CK_D45_DIV, the phase keeps unchanged. That is, CK_D45_DIV and CK_D45_DIV_S are same.

For the second divided signal CK_D135_DIV, the phase is shifted backward by one clock period to obtain CK_D135_DIV_S.

For the third divided signal CK_D225_DIV, the phase is shifted backward by two clock periods to obtain CK_D225_DIV_S.

For the fourth divided signal CK_D315_DIV, the phase is shifted backward by three clock periods to obtain CK_D315_DIV_S.

The delay locked loop 400 further outputs another four different delayed signals CK_D90, CK_D180, CK_D270, and CK_D360, which are obtained by being delayed by $\pi/2$, $\pi$, $3\pi/2$, and $2\pi$ on the basis of the reference clock respectively.

After signal CK_D45_DIV_S selecting signal CK_D90, signal CK_D135_DIV_S selecting signal CK_D180, signal CK_D225_DIV_S selecting signal CK_D270, and signal CK_D360 selecting signal CK_D315_DIV_S, they are synthesized into an output signal CK_OUT of the entire multiphase multiplexing circuit 200.

A frequency of the signal CK_OUT is four-fifth times of the frequency of the reference clock, and a jitter of the signal CK_OUT is basically same as a jitter of a single clock. The testing instrument 500 only needs to measure the frequency and the jitter of the signal CK_OUT.

In other embodiment, the delay locked loop may output other numbers of different delayed clock signals according to actual needs.

The multiphase multiplexing circuit 200 multiplexes multiphase clocks output from the delay locked loop 400 into one output, a frequency of the new clock signal is decreased, and a requirement of sensitivity to the testing environment is reduced. Meanwhile, as multiple clock signals with different delays are synthesized into one signal in the chip, there is no matching problem of signal paths of the multiple clocks, and an external influence is reduced.

Figure 6:
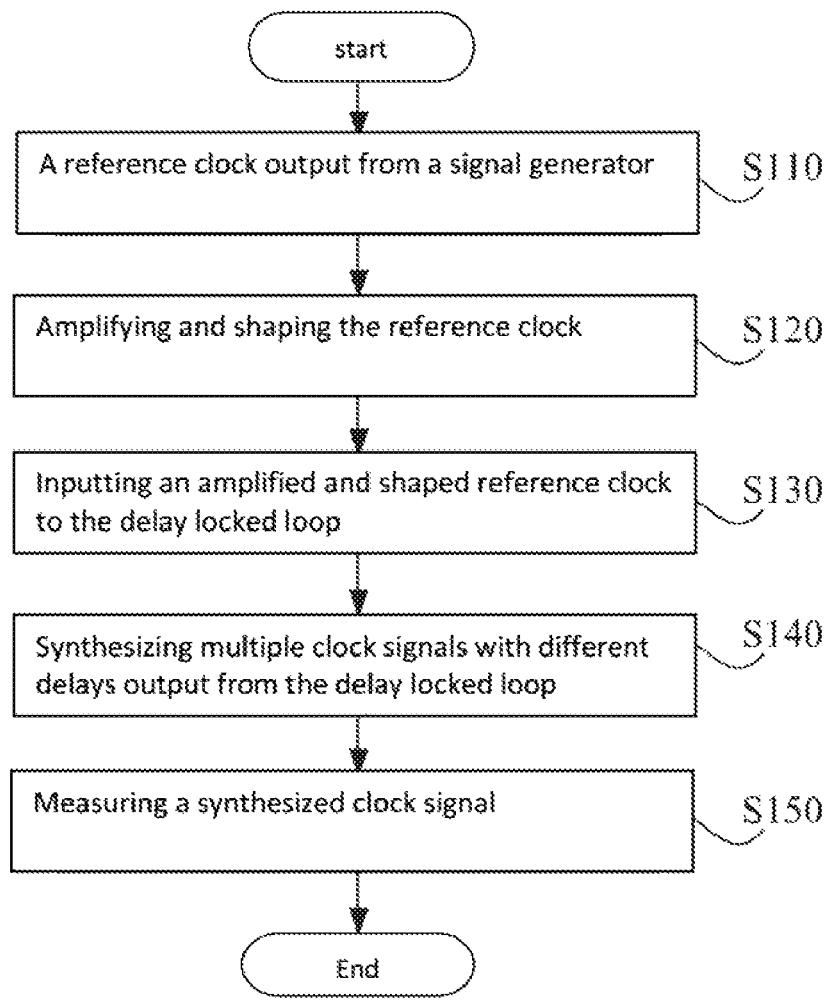
FIG. 6 is a flowchart of a method of detecting a delay locked loop in accordance with an embodiment.

FIG. 6 is a flowchart of a method of detecting a delay locked loop in accordance with an embodiment. The method includes following steps.

In step S110, a reference clock is output from a signal generator.

In step S120, the reference clock is amplified and shaped.

In step S130, an amplified and shaped reference clock is input into the delay locked loop.

In step S140, multiple clock signals with different delays output from the delay locked loop are synthesized.

In step S150, a synthesized clock signal is tested.

In the above mentioned method, by amplifying and shaping the reference clock before the reference clock is input into the delay locked loop, it reduces an influence of the reference clock input into the delay locked loop. By synthesizing multiple delayed clocks into one clock, different delayed clocks do not need to be coupled to different testing instruments through different lines during a measurement, thereby reducing measurement error.

In addition to steps S110, S130 and S150, it can be understood that in order to maximize an effect of suppressing an influence of a testing environment, the method may include both steps S120 and S140 at the same time. It should be noted that the step S120 or the step S140 alone can partly improve the detection result as well. When only the step S120 is included, the step S150 needs to separately detect different clock signals.

Prior to that the reference clock is amplified and shaped, the method further includes filtering the reference clock.

The step S120 of amplifying and shaping the reference clock specifically includes:

In step S121, the input reference clock is amplified and a double-ended signal is output.

A differential comparator can be used to amplify the input reference clock and output a double-ended signal. The differential comparator has a strong common mode rejection and is insensitive to fluctuations of a power supply and the ground. The differential comparator further has a hysteresis function that can distinguish a signal even when signal amplitude is small and noise is great. Although the reference clock may be greatly attenuated and distorted during the transmission from the signal generator to the delay locked loop, it can be corrected by the differential comparator, therefore reducing the requirements of the testing environment.

In step S122, the double-ended signal is converted into a single-ended signal.

In many applications, signals are mostly single-ended signals, so the double-ended signals needs to be converted into single-ended signals.

In step S123, the single-ended signal is shaped and a driving capability of the singled-ended signal is enhanced.

By above mentioned processing, a standard square wave signal can be obtained even after that the reference clock is attenuated and distorted due to influences of the testing environment.

The step S140 of synthesizing multiple clock signals with different delays specifically includes:

In step S141, N first type delayed clocks output from the delay locked loop 400 is received, and the first type delayed clocks are N+1 frequency divided respectively, wherein a $n^{th}$ first type delayed clock is delayed by a phase of $(2n-1)\pi/N$ with respect to the reference clock, wherein $1 \leq n \leq N$.

In step S142, a frequency divided signal corresponding to the $n^{th}$ delay clock is shifted by n-1 clock periods.

In step S143, for N shifted signals, corresponding N second type delayed clocks are selected to obtain N clock signals respectively, and the N clock signals are synthesized, wherein a $n^{th}$ second type delay clock is delayed by a phase of $2n\pi/N$ with respect to the reference clock.

Referring to FIG. 5, the following is specifically described when N=4.

The reference clock is indicated as CK. The delay locked loop outputs four different delayed signals CK_D45, CK_D135, CK_D225, and CK_D315, which are obtained by being delayed by $\pi/4$, $3\pi/4$, $5\pi/4$, and $7\pi/4$ respectively on the basis of the reference clock.

Four different delayed signals CK_D45, CK_D135, CK_D225 and CK_D315 are respectively five frequency divided to obtain CK_D45_DIV, CK_D135_DIV, CK_D225_DIV, and CK_D315_DIV.

For the first divided signal CK_D45_DIV, the phase keeps unchanged. That is, CK_D45_DIV and CK_D45_DIV_S are the same.

For the second divided signal CK_D135_DIV, the phase is shifted backward by one clock period to obtain CK_D135_DIV_S.

For the third divided signal CK_D225_DIV, the phase is shifted backward by two clock periods to obtain CK_D225_DIV_S.

For the fourth divided signal CK_D315_DIV, the phase is shifted backward by three clock periods to obtain CK_D315_DIV_S.

The delay locked loop further outputs another four different delayed signals CK_D90, CK_D180, CK_D270, and CK_D360, which are obtained by being delayed by $\pi/2$, $\pi$, $3\pi/2$, and a respectively on the basis of the reference clock.

After signal CK_D45_DIV_S selecting signal CK_D90, signal CK_D135_DIV_S selecting signal CK_D180, signal CK_D225_DIV_S selecting signal CK_D270, and signal CK_D315_DIV_S selecting signal CK_D360, they are synthesized into an output signal CK_OUT of the entire multiphase multiplexing circuit 200.

A frequency of the signal CK_OUT is four-fifth times of a frequency of the reference clock, and a jitter of the signal CK_OUT is basically same as a jitter of a single clock. The testing instrument 500 only needs to measure the frequency and jitter of the signal CK_OUT.

In other embodiments, the delay locked loop can output other numbers of delayed clock signals according to actual needs.

In the above mentioned system and method, the high-speed input signal is amplified and shaped by the amplifying circuit with a hysteresis function, and then the amplified and shaped signal is output to the delay locked loop, thereby solving the problem that the testing environment may deteriorate the input signal. The hysteresis function can filter out small signal noise, therefore facilitating signal shaping and post circuit reception.

The multiphase clock, which is originally led to multiple clocks with different phases, generated by the delay locked loop is synthesized by the internal auxiliary circuit into a synthesized signal. The synthesized signal is output to the testing instrument. By measuring the frequency and jitter of the output signal, it shows the delays between multiple clock signals, therefore eliminating deriving multiple clock measurements. The system and the method eliminate the need for the matching between multiple clock paths, and need lower requirements of the testing environment and the testing instruments.

The post multiphase multiplexing circuit consists of a frequency divider and a shifter, both of which are standard digital circuit units that is easy to implement, of less difficulty to design, and of less impact on the process.

In addition to adding two complementary circuits, that is, the pre-receiving circuit and the multiphase multiplexing circuit, the delay locked loop itself does not require any other modification, and the addition of the two complementary circuits has no other effects on the performance of the delay locked loop.

In order to make the description simple, all other possible combinations of the technical features in the foregoing embodiments are not described. However, as long as there is no conflict between the technical features of the embodiments in other possible combinations, they should be considered as the scope of this manual.

The above-mentioned embodiments merely present several embodiments of the present disclosure, which are described specifically and in detail but should not be interpreted as limit to the scope of the present disclosure. It should be noted that those skilled in the art may make various modifications and improvements without departing from the concept of the present disclosure, all of which fall in the protection scope of the present disclosure. Therefore, the protection scope of the present disclosure shall be subject to the appended claims.

What is claimed is:

1. A system of detecting a work state of a delay locked loop, comprising:
    a signal generator configured to generate a reference clock;
    a pre-receiving circuit configured to receive the reference clock, amplify and shape the reference clock, and provide an amplified and shaped signal to the delay locked loop; and
    a testing instrument configured to acquire a clock signal output from the delay locked loop and determine whether a time delay of the clock signal is consistent with expectation,
    wherein the pre-receiving circuit comprises at least one of:
        a differential comparator configured to amplify the received reference clock and output a double-ended signal;
        a double-end-to-single-end module coupled to an output end of a differential comparator configured to receive a double-ended signal output from the differential comparator and convert the double-ended signal into a single ended signal; or
        a buffer amplifying module coupled to an output end of a double-end-to-single-end module configured to receive a single ended signal, shape the single ended signal and enhance a driving capability of the shaped single ended signal.

2. The system according to claim 1, wherein the pre-receiving circuit has a hysteresis function.

3. The system according to claim 1, wherein the pre-receiving circuit comprises:
    the differential comparator configured to amplify the received reference clock and output the double-ended signal;
    the double-end-to-single-end module coupled to the output end of the differential comparator configured to receive the double-ended signal output from the differential comparator and convert the double-ended signal into the single ended signal; and
    the buffer amplifying module coupled to the output end of the double-end-to-single-end module configured to receive the single ended signal, shape the single ended signal and enhance the driving capability of the shaped single ended signal.

4. The system according to claim 1, further comprising a multiphase multiplexing circuit configured to receive clock signals output from the delay locked loop, synthesize multiple clock signals with deferent delays, and provide a synthesized signal to the testing instrument.

5. The system according to claim 4, wherein the multiphase multiplexing circuit comprises:
    a frequency divider configured to receive N first type delayed clocks output from the delay locked loop, and N+1 frequency divide each first type delayed clock respectively, wherein a $n^{th}$ first type delayed clock is delayed by a phase of $(2n-1)\pi/N$ with respect to the reference clock, wherein $1 \leq n \leq N$;
    a shifter configured to shift a frequency divided signal corresponding to the $n^{th}$ delayed clock by $n-1$ clock periods; and
    a multiplexing module configured to select N clock signals corresponding to N second type delayed clock respectively utilizing N shifted signals obtained by the shifter, and synthesize the N clock signals, wherein a $n^{th}$ second type clock is delayed by a phase of $2n\pi/N$ with respect to the reference clock.

6. The system according to claim 5, wherein N=4.

7. A system of detecting a work state of a delay locked loop, comprising:
    a signal generator configured to generate a reference clock and provide the reference clock to the delay locked loop;
    a testing instrument configured to acquire clock signals output from the delay locked loop and determine whether time delays of the clock signals are consistent with expectations; and
    a multiphase multiplexing circuit configured to receive clock signals output from the delay locked loop, synthesize the clock signals with different delays, and provide a synthesized signal to the testing instrument, wherein the multiphase multiplexing circuit comprises at least one of:

a frequency divider configured to receive N first type delayed clocks output from the delay locked loop, and N+1 frequency divide each first type delayed clock respectively, wherein a $n^{th}$ first type delayed clock is delayed by a phase of $(2n-1)\pi/N$ with respect to the reference clock;

a shifter configured to shift a frequency divided signal corresponding to a $n^{th}$ delayed clock by n−1 clock periods; or a multiplexing module configured to select N clock signals corresponding to N second type delayed clocks respectively utilizing N shifted signal obtained by a shifter, and synthesize the N clock signals, wherein a $n^{th}$ second type delayed clock is delayed by a phase of $2n\pi/N$ with respect to the reference clock.

8. The system according to claim 7, wherein the multiphase multiplexing circuit comprises:

the frequency divider configured to receive N first type delayed clocks output from the delay locked loop, and N+1 frequency divide each first type delayed clock respectively, wherein the $n^{th}$ first type delayed clock is delayed by the phase of $(2n-1)\pi/N$ with respect to the reference clock;

the shifter configured to shift the frequency divided signal corresponding to the $n^{th}$ delayed clock by n−1 clock periods; and the multiplexing module configured to select N clock signals corresponding to N second type delayed clocks respectively utilizing N shifted signal obtained by the shifter, and synthesize the N clock signals, wherein the $n^{th}$ second type delayed clock is delayed by the phase of $2n\pi/N$ with respect to the reference clock.

9. A method of detecting a work state of a delay locked loop, comprising:

amplifying and shaping a reference clock;

inputting an amplified and shaped reference clock to the delay locked loop; and receiving clocks output from the delay locked loop and testing the clocks, wherein the step of amplifying and shaping the reference clock comprises at least one of:

differential-amplifying the reference clock and outputting a double-ended signal;

converting a double-ended signal into a single ended signal; or shaping a single ended signal and enhancing a driving capability of the single ended signal.

10. The method according to claim 9, wherein prior to amplifying and shaping the reference clock, the method further comprises filtering the reference clock.

11. The method according to claim 9, wherein the step of amplifying and shaping the reference clock comprises:

differential-amplifying the reference clock and outputting the double-ended signal;

converting the double-ended signal into the single ended signal; and shaping the single ended signal and enhancing the driving capability of the single ended signal.

12. The method according to claim 9, further comprising synthesizing multiple clock signals with different delays and testing the synthesized signal prior to receiving clocks output from the delay locked loop.

13. The method according to claim 12, wherein the step of synthesizing multiple clock signals with different delays comprises:

receiving N first type delayed clocks output from the delay locked loop and N+1 frequency dividing each first type delayed clock respectively, wherein a $n^{th}$ first type delayed clock is delayed by a phase of $(2n-1)\pi/N$ with respect to the reference clock, wherein 1≤n≤N;

shifting a frequency divided signal corresponding to the $n^{th}$ delayed clock by n−1 clock periods; and for N shifted signals, selecting corresponding N second type delayed clocks to obtain N clock signals respectively, and synthesizing the N clock signals, wherein a $n^{th}$ second type delayed clock is delayed by a phase of $2n\pi/N$ with respect to the reference clock.

14. The method according to claim 13, wherein N=4.

15. A method of detecting a work state of a delay locked loop, comprising:

inputting a reference clock to the delay locked loop;

synthesizing multiple clock signals with different delays; and receiving a synthesized clock output from the delay locked loop and testing the synthesized clock, wherein the step of synthesizing multiple clock signals with different delays comprises at least one of:

receiving N first type delayed clocks output from the delay locked loop and N+1 frequency dividing each first type delayed clock respectively, wherein a $n^{th}$ first type delayed clock is delayed by a phase of $(2n-1)\pi/N$ with respect to the reference clock, wherein 1≤n≤N;

shifting a frequency divided signal corresponding to a $n^{th}$ delayed clock by n−1 clock periods; or for N shifted signals, selecting corresponding N second type delayed clocks to obtain N clock signals respectively, and synthesizing the N clock signals, wherein a $n^{th}$ second type delayed clock is delayed by a phase of $2n\pi/N$ with respect to the reference clock.

16. The method according to claim 15, wherein the step of synthesizing multiple clock signals with different delays comprises:

receiving N first type delayed clocks output from the delay locked loop and N+1 frequency dividing each first type delayed clock respectively, wherein the $n^{th}$ first type delayed clock is delayed by the phase of $(2n-1)\pi/N$ with respect to the reference clock, wherein 1≤n≤N;

shifting the frequency divided signal corresponding to the $n^{th}$ delayed clock by n−1 clock periods; and for N shifted signals, selecting corresponding N second type delayed clocks to obtain N clock signals respectively, and synthesizing the N clock signals, wherein the $n^{th}$ second type delayed clock is delayed by the phase of $2n\pi/N$ with respect to the reference clock.

* * * * *